(12) United States Patent
Lee et al.

(10) Patent No.: US 11,615,967 B2
(45) Date of Patent: Mar. 28, 2023

(54) POWER MODULE PACKAGE AND METHOD OF MANUFACTURING THE SAME

(71) Applicant: SEMICONDUCTOR COMPONENTS INDUSTRIES, LLC, Phoenix, AZ (US)

(72) Inventors: Keunhyuk Lee, Suzhou (CN); Oseob Jeon, Seoul (KR); Joonseo Son, Seoul (KR); Seungwon Im, Seoul (KR)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 28 days.

(21) Appl. No.: 17/315,671

(22) Filed: May 10, 2021

(65) Prior Publication Data
US 2021/0265175 A1    Aug. 26, 2021

Related U.S. Application Data

(62) Division of application No. 14/513,456, filed on Oct. 14, 2014, now Pat. No. 11,004,698.

(30) Foreign Application Priority Data

Oct. 15, 2013   (KR) ............................. 20130122942

(51) Int. Cl.
*H01L 25/00*    (2006.01)
*H01L 21/56*    (2006.01)
(Continued)

(52) U.S. Cl.
CPC ........ *H01L 21/565* (2013.01); *H01L 23/3121* (2013.01); *H01L 23/3735* (2013.01);
(Continued)

(58) Field of Classification Search
CPC ................................................... H05K 3/4046
See application file for complete search history.

(56) References Cited

U.S. PATENT DOCUMENTS 5,975,913 A    11/1999   Wada et al.
6,735,855 B2    5/2004   Akram et al.
(Continued)

FOREIGN PATENT DOCUMENTS

JP    H08139218 A    5/1996
JP    2007184315 A   7/2007
(Continued)

OTHER PUBLICATIONS

Office Action for Korean Application No. 10-2013-0122942, dated Jan. 9, 2020, (and English translation), 12 pages.
U.S. Appl. No. 14/513,456, filed Oct. 14, 2014, Allowed.

*Primary Examiner* — Mounir S Amer
*Assistant Examiner* — Alexander Belousov
(74) *Attorney, Agent, or Firm* — Brake Hughes Bellermann LLP

(57) ABSTRACT

A method can include coupling a semiconductor chip and an electrode with a substrate. Bottom and top mold die can be use, where the top mold die define a first space and a second space that is separated from the first space. The method can include injecting encapsulation material to form an encapsulation member coupled to and covering at least a portion of the substrate. The encapsulation member can include a housing unit housing the electrode. The electrode can have a conductive sidewall exposed to, and not in contact with the encapsulation member, such that there is open space between the conductive sidewall of the electrode and the encapsulation member from an uppermost surface to a bottommost surface of the encapsulation member, the substrate can having a portion exposed within the open space, (Continued)

and the encapsulation member can have an open cross-section perpendicular to an upper surface of the substrate.

20 Claims, 11 Drawing Sheets

(51) Int. Cl.
*H05K 3/28* (2006.01)
*H01L 23/498* (2006.01)
*H01L 23/373* (2006.01)
*H01L 23/31* (2006.01)
*H01L 25/07* (2006.01)
*H01L 21/60* (2006.01)
*H01L 23/00* (2006.01)
*H05K 3/40* (2006.01)

(52) U.S. Cl.
CPC .. *H01L 23/49811* (2013.01); *H01L 23/49844* (2013.01); *H01L 25/072* (2013.01); *H05K 3/284* (2013.01); *H01L 24/32* (2013.01); *H01L 24/40* (2013.01); *H01L 24/48* (2013.01); *H01L 24/73* (2013.01); *H01L 2021/60015* (2013.01); *H01L 2021/60277* (2013.01); *H01L 2224/2929* (2013.01); *H01L 2224/29101* (2013.01); *H01L 2224/29301* (2013.01); *H01L 2224/32225* (2013.01); *H01L 2224/40095* (2013.01); *H01L 2224/40225* (2013.01); *H01L 2224/48091* (2013.01); *H01L 2224/48227* (2013.01); *H01L 2224/73221* (2013.01); *H01L 2224/73263* (2013.01); *H01L 2224/73265* (2013.01); *H01L 2224/8385* (2013.01); *H01L 2224/83801* (2013.01); *H01L 2224/84815* (2013.01); *H01L 2224/92246* (2013.01); *H01L 2224/92247* (2013.01); *H01L 2924/00014* (2013.01); *H01L 2924/07811* (2013.01); *H01L 2924/13055* (2013.01); *H01L 2924/13091* (2013.01); *H01L 2924/181* (2013.01); *H05K 3/4015* (2013.01); *H05K 2201/10318* (2013.01); *H05K 2201/10333* (2013.01); *H05K 2203/1316* (2013.01); *Y10T 29/49133* (2015.01)

(56) References Cited

U.S. PATENT DOCUMENTS

| | | | |
|---|---|---|---|
| 7,208,833 | B2 | 4/2007 | Nobori et al. |
| 7,361,031 | B2 | 4/2008 | Matsumura |
| 7,891,980 | B2 | 2/2011 | Frasco |
| 8,064,214 | B2 | 11/2011 | Frasco |
| 8,125,080 | B2 | 2/2012 | Lee |
| 8,932,090 | B2 | 1/2015 | Jaeckle et al. |
| 9,202,798 | B2 * | 12/2015 | Yoo .................. H01L 23/49811 |
| 9,209,114 | B2 * | 12/2015 | Yoo ........................ H01L 23/055 |
| 9,455,207 | B2 * | 9/2016 | Kim .................. H01L 24/37 |
| 9,698,125 | B2 * | 7/2017 | Sato .................. H01L 23/49838 |
| 10,236,274 | B2 * | 3/2019 | Sato ..................... H01L 25/072 |
| 2002/0133941 | A1 | 9/2002 | Akram et al. |
| 2007/0170416 | A1 | 7/2007 | Tsukagoshi |
| 2008/0202799 | A1 | 8/2008 | Graydon et al. |
| 2009/0127691 | A1 | 5/2009 | Lee |
| 2010/0013085 | A1 | 1/2010 | Oi et al. |
| 2012/0098138 | A1 | 4/2012 | Oka et al. |
| 2013/0258624 | A1 | 10/2013 | Hardin |

FOREIGN PATENT DOCUMENTS

| | | |
|---|---|---|
| JP | 2012089681 A | 5/2012 |
| JP | 2013089893 A | 5/2013 |

* cited by examiner

POWER MODULE PACKAGE AND METHOD OF MANUFACTURING THE SAME

RELATED APPLICATION

This application is a divisional of U.S. application Ser. No. 14/513,456, filed on Oct. 14, 2014, which claims the benefit of Korean Patent Application No. 10-2013-0122942, filed on Oct. 15, 2013, in the Korean Intellectual Property Office, the disclosures of which are incorporated herein in their entirety by reference.

BACKGROUND

1. Field

One or more embodiments of the inventive concept relate to a power module package and a method of manufacturing the same, and more particularly, to a power module package having a simplified structure and a method of manufacturing the same.

2. Description of the Related Art

With the development of power devices applied to vehicles, industrial machinery, and home appliances, the demand for power devices which are lightweight, small in size and have excellent performance has increased. Accordingly, a multichip power module package in which a plurality of semiconductor chips are mounted in one chip is commonly used, and research into simplifying a structure of the multichip power module package and reducing a size thereof has been actively conducted.

For example, a structure is suggested in which electrodes for connecting a semiconductor chip with external terminals are mounted and molded on a substrate on which the semiconductor chip is arranged, without any lead frame. The multichip power module package having the above-described structure may have a simplified structure, be lightweight and small in size because no lead frames are used during high integration. However, electrodes of the multichip power module package are frequently damaged during a transfer molding process, and thus, malfunctions may result.

SUMMARY

One or more embodiments of the inventive concept include a power module package that has a simplified structure and may have improved reliability by effectively preventing damage to electrodes of the power module package, and a method of manufacturing the same.

Additional aspects will be set forth in part in the description which follows and, in part, will be apparent from the description, or may be learned by practice of the presented embodiments.

According to one or more embodiments of the inventive concept, a power module package includes: a substrate; at least one electrode arranged on the substrate; and an encapsulation member covering at least a portion of the substrate, the encapsulation member including a housing unit housing the at least one electrode, wherein the at least one electrode is spaced apart from the encapsulation member.

The housing unit may have a closed cross-section arranged in a first direction perpendicular to an upper surface of the substrate.

The housing unit may have an open cross-section arranged in a first direction perpendicular to an upper surface of the substrate.

The housing unit may house two or more electrodes.

The at least one electrode may have an exposed upper surface and an exposed side.

An upper surface of the at least one electrode may be disposed at a higher level than an upper surface of the encapsulation member based on an upper surface of the substrate.

The at least one electrode may have a pillar shape.

The at least one electrode may have a cross-sectional area in a first direction perpendicular to an upper surface of the substrate, and the cross-sectional area may be constant or vary according to the first direction.

The at least one electrode may include a socket member contacting the substrate and having a hole in which an external pin member is removably arranged.

The socket member may include: a base unit contacting an upper surface of the substrate; and a body unit extending from the base unit in a first direction perpendicular to the upper surface of the substrate, the body unit including the hole.

The at least one electrode may further include a pin member connected to the socket member. The pin member may extend in a first direction perpendicular to an upper surface of the substrate, and a top surface of the pin member may have a level higher than that of a top surface of the socket member.

The substrate may include: an insulation body; an upper conductive pattern formed on an upper surface of the insulation body; and a lower conductive pattern formed on a lower surface of the insulation body. The at least one electrode is disposed on the upper conductive pattern.

The power module package may further include: at least one semiconductor chip arranged on the substrate; and wiring members electrically connecting the at least one semiconductor chip and the at least one electrode. The at least one semiconductor chip and the wiring members may be covered by the encapsulation member.

According to one or more embodiments of the inventive concept, a method of manufacturing a power module package, the method includes: arranging at least one semiconductor chip on a substrate; arranging at least one electrode on the substrate; forming wiring members electrically connecting the at least one semiconductor chip and the at least one electrode; mounting the substrate on a bottom mold die and bonding the bottom mold die to a top mold die, the top mold die comprising a first part and a second part, the first part defining a first space where the at least one semiconductor chip and the wiring members are housed, and the second part defining a second space where the at least one electrode is housed; and injecting an encapsulation member into the first space to cover at least a portion of the substrate, the at least one semiconductor chip, and the wiring members.

The injecting of the encapsulation member may include injecting the encapsulation member into the first space and not into the second space.

The second part may be spaced apart from the at least one electrode.

The second part may have a depth greater than that of the first part based on an upper surface of the substrate.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1A:
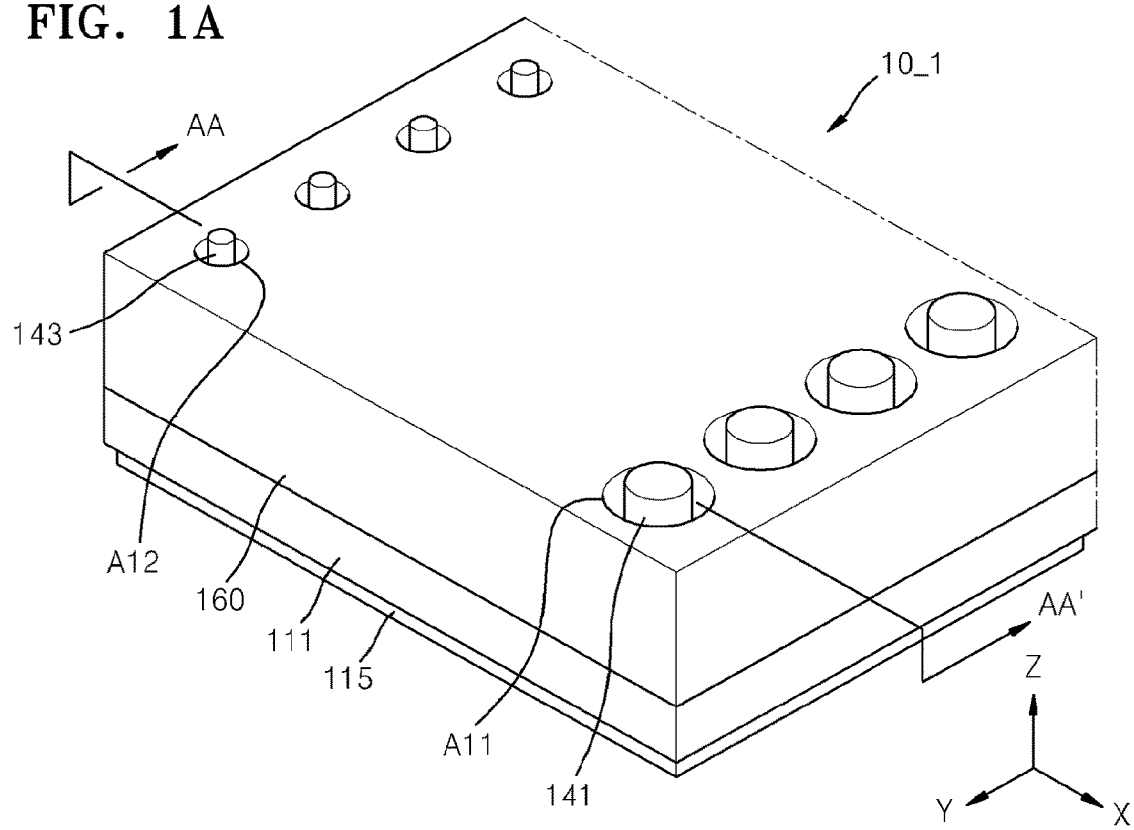
FIG. 1A is a schematic perspective view of a portion of a power module package according to an embodiment of the inventive concept.

Hereinafter, the inventive concept will be described in detail by explaining preferred embodiments of the invention with reference to the attached drawings. Like reference numerals in the drawings denote like elements, and repeated descriptions thereof will be omitted.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of", when preceding a list of elements, modify the entire list of elements and do not modify the individual elements of the list.

While such terms as "first", "second", etc., may be used to describe various members, areas, layers, parts and/or components, such members, areas, layers, parts and/or components must not be limited to the above terms. The above terms are used only to distinguish one member, area, layer, part and/or component from another. Therefore, a first member, member, area, layer, part and/or component discussed below could be termed a second member, member, area, layer, part and/or component within the teachings of the invention, and similarly, a second member, member, area, layer, part and/or component may be termed a first member, member, area, layer, part and/or component without departing from the teachings of this disclosure.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1B:
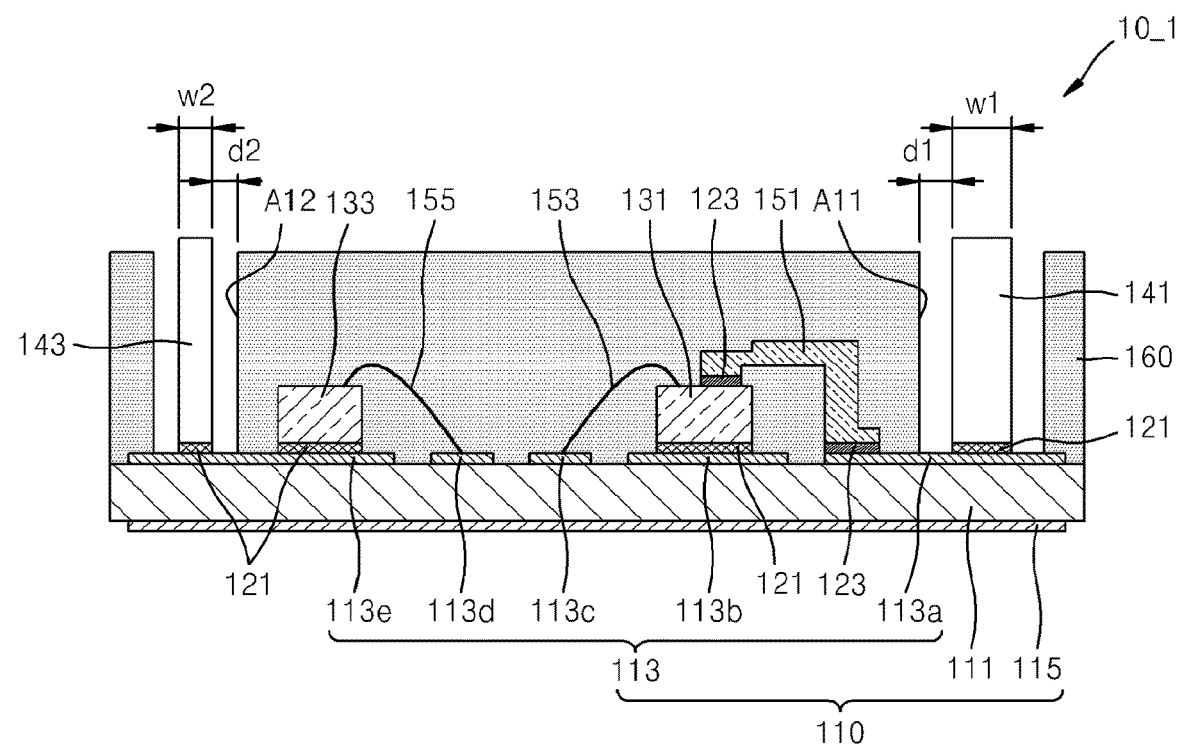
FIG. 1B is a cross-sectional view of some components of the power module package, taken along a line AA-AA' of FIG. 1A.

FIG. 1A is a schematic perspective view of a portion of a power module package 10_1 according to an embodiment of the inventive concept, FIG. 1B is a cross-sectional view of some components of the power module package 10_1, taken along a line AA-AA' of FIG. 1A, and FIGS. 1C to 1E are cross-sectional views of a structure of a first electrode 141 of FIG. 1A.

Referring to FIGS. 1A and 1B, the power module package 10_1 may include a substrate 110, first and second semiconductor chips 131 and 133 arranged on the substrate 110, first to third wiring members 151, 153 and 155, an encapsulation member 160 covering at least some portions of the substrate 110, the first and second semiconductor chips 131 and 133, and the first to third wiring members 151, 153 and 155 and including first and second housing units A11 and A12, first electrodes 141 respectively disposed in the first housing units A11 on the substrate 110, and second electrodes 143 respectively disposed in the second housing units A12 on the substrate 110.

The substrate 110 may be a direct bonding copper (DBC) substrate, but is not limited thereto. In some embodiments, the substrate 110 may be a direct plated copper (DPC) substrate or a thick or thin film copper (TFC) substrate. In other embodiments, the substrate 110 may be an insulated metal substrate or a metalizing ceramic substrate. In other embodiments, the substrate 110 may be, for example, a printed circuit board (PCB) or a flexible PCB. Hereinafter, a case where the substrate 110 is the DBC substrate will be described for convenience of explanation.

The substrate 110 may include an insulation body 111 formed of insulating materials such as ceramics, upper conductive patterns 113 formed on an upper surface of the insulation body 111, and a lower conductive pattern 115 formed on a lower surface of the insulation body 111. The upper conductive patterns 113 may include first to fifth upper conductive patterns 113a to 113e which are spaced apart from one another or at least two of which are connected. The lower conductive pattern 115 may be exposed to an outside of the encapsulation member 160 in order to increase the efficiency of thermal emission. Although not illustrated, the lower conductive pattern 115 exposed to the outside of the encapsulation member 160 may be connected to a heat sink. The first to fifth upper conductive patterns 113a to 113e and the lower conductive pattern 115 may be formed of conductive materials such as copper.

The first semiconductor chip 131 may be arranged on the second upper conductive pattern 113b of the substrate 110, and the second semiconductor chip 133 may be arranged on the fifth upper conductive pattern 113e of the substrate 110.

The first and second semiconductor chips 131 and 133 may include a power semiconductor device and a controlling semiconductor device, respectively. For example, the first and second semiconductor chips 131 and 133 may include a bipolar junction transistor (BJT), an insulated-gate bipolar transistor (IGBT), or a diode device. Alternatively, the first and second semiconductor chips 131 and 133 may respectively include a metal oxide semiconductor field effect transistor (MOSFET) for controlling power, for example, a servo driver, an inverter, a power regulator, a converter, or the like. Each of the first and second semiconductor chips 131 and 133 may include passive elements for operating components thereof.

First bonding members 121 may be interposed between the first semiconductor chip 131 and the second upper conductive pattern 113b and between the second semiconductor chip 133 and the fifth upper conductive pattern 113e. That is, the first and second semiconductor chips 131 and 133 may be bonded to the second and fifth upper conductive patterns 113b and 113e by disposing the first bonding members 121 therebetween. The first bonding members 121 may be formed of conductive adhesive materials, for example, solders or epoxy including metal ingredients.

The first semiconductor chip 131 may be electrically connected to the first upper conductive pattern 113a via the first wiring member 151. Since the first electrodes 141 are arranged on the first upper conductive pattern 113a, the first semiconductor chip 131 may be electrically connected to the first electrodes 141. The first wiring member 151 may be formed of a conductive wiring member having a certain width and thickness, for example, a bonding clip, a bonding ribbon, etc. In other embodiments, the first wiring member 151 may be formed of bonding wire having a line shape.

The first semiconductor chip 131 may be electrically connected to the third upper conductive pattern 113c via the second wiring member 153. As shown in FIG. 1B, the third upper conductive pattern 113c is spaced apart from the first, second, fourth and fifth upper conductive patterns 113a, 113b, 113d and 113e, but the inventive concept is not limited thereto. Although not illustrated, the third upper conductive pattern 113c may be connected to at least one of the first, second, fourth and fifth upper conductive patterns 113a, 113b, 113d and 113e. The second wiring member 153 may be formed of, for example, bonding wire.

A connection of the first semiconductor chip 131 to the first to third upper conductive patterns 113a to 113c will be further described based on a case where the first semiconductor chip 131 is an IGBT. A second bonding member 123 is formed on any one of an emitter electrode, a base electrode and a gate electrode, which are formed to be spaced apart from each other on an upper surface of the first semiconductor chip 131, and the second bonding member 123 is formed on the first upper conductive pattern 113a. The first wiring member 151 is bonded to the second bonding member 123. Thus, the first semiconductor chip 131 may be electrically connected to the first upper conductive pattern 113a. The third upper conductive pattern 113c may be electrically connected to any one of an emitter electrode, a base electrode and a gate electrode, which are formed to be spaced apart from each other on the upper surface of the first semiconductor chip 131, via the second wiring member 153. A collector electrode formed on a lower surface of the first semiconductor chip 131 may be electrically connected to the second upper conductive pattern 113b.

The second semiconductor chip 133 may be electrically connected to the fourth upper conductive pattern 113d via the third wiring member 155. In FIG. 1B, the fourth upper conductive pattern 113d is spaced apart from the first to third upper conductive patterns 113a to 113c and the fifth upper conductive pattern 113e, but is not limited thereto. Although not illustrated, the fourth upper conductive pattern 113d may be connected to at least one of the first, second, third and fifth upper conductive patterns 113a, 113b, 113c and 113e. The second wiring member 153 may be formed of, for example, bonding wire.

The second semiconductor chip 133 may be electrically connected to the second electrodes 143 because the second semiconductor chip 133 is arranged on the fifth upper conductive pattern 113e. The third wiring member 155 may be formed of, for example, bonding wire.

A connection of the second semiconductor chip 133 to the fourth and fifth upper conductive patterns 113d and 113e may be similar to the connection of the first semiconductor chip 131, thus omitting the detailed descriptions.

The encapsulation member 160 may be formed to cover the substrate 110, the first and second semiconductor chips 131 and 133, and the first to third wiring members 151, 153 and 155. The encapsulation member 160 may be, for example, an epoxy mold compound (EMC), but is not limited thereto. The encapsulation member 160 may be formed of any one of thermosetting materials, thermoplastic materials, ultraviolet-curable materials and silicon-based materials.

The encapsulation member 160 may include a plurality of the first units A11 and a plurality of the second housing units A12. In FIG. 1A, the plurality of the first units A11 are arranged in a direction parallel to an upper surface of the substrate (for example, in a Y direction of FIG. 1A) and the plurality of the second housing units A12 are arranged in a Y direction, but an arrangement direction of the first and second housing units A11 and A12 is not limited thereto. The first and second housing units A11 and A12 may be arranged in an X direction of FIG. 1A. Alternatively, the first and second housing units A11 and A12 may be arranged in different directions so as to cross each other, or may be alternately arranged in one direction.

The first and second housing units A11 and A12 may have spaces in the encapsulation member 160 where the first and second electrodes 141 and 143 are housed. In some embodiments, the first and second housing units A11 and A12 may be holes that penetrate the encapsulation member 160 and respectively have the first and second electrodes 141 and 143 therein.

Each of the first and second housing units A11 and A12 has a closed cross-section along a plane parallel to the upper surface of the substrate (for example, along a plane perpendicular to a Z axis of FIG. 1A). That is, the first and second housing units A11 and A12 may have a shape of which a vertical cross-section is closed. For example, the first and second housing units A11 and A12 may be a pillar of which a vertical cross-section is closed. However, the inventive concept is not limited thereto. The first and second housing units A11 and A12 may be a polygon of which a vertical cross-section is closed. In FIGS. 1A and 1B, each of the first and second housing units A11 and A12 has a constant width in the X or the Y direction, but the widths thereof are not limited thereto.

The plurality of the first housing units A11 may house a plurality of the first electrodes 141, respectively. That is, each of the plurality of the first electrodes 141 may be disposed in the plurality of the first housing units A11 of the substrate 110. In detail, the first electrodes 141, which are respectively disposed in the first housing units A11, may be bonded to the first upper conductive pattern 113a by the first bonding member 121 interposed therebetween. As the first upper conductive pattern 113a is electrically connected to the first semiconductor chip 131 via the first bonding member 151, the first electrodes 141 may transmit power provided by an external device to the first semiconductor chip 131.

The first electrodes 141 may be a pillar having a first width w1. As shown in FIGS. 1A and 1B, the first electrodes 141 may have a closed cross-section on a top or bottom thereof, but the inventive concept is not limited thereto. The first electrodes 141 may be a polygonal pillar of which a vertical cross-section is a polygon.

Figure 1C:
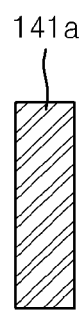
FIGS. 1C to 1E are cross-sectional views of structures of a first electrode of FIG. 1A.
Figure 1D:
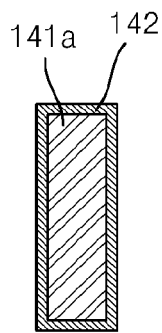
Figure 1E:
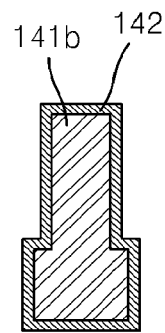

Structures of the first electrodes 141 will be described in detail with reference to FIGS. 1C to 1E. As shown in FIG. 1C, the first electrodes 141 may be a pillar 141a formed of a conductive material, for example, Au. Alternatively, as shown in FIG. 1D, the first electrodes 141 may be a pillar 141a covered with a conductive coating layer 142 formed of, for example, nickel (Ni) or Tin (Sn). Alternatively, as shown in FIG. 1E, the first electrodes 141 may be a pillar 141b having an inverted T-shape, that is, the width of a vertical cross-section of pillar 141b changes according to an extension direction, and may have a structure in which the conductive coating layer 142 is further formed on a surface of each of the first electrodes 141.

Referring back to FIG. 1B, the first electrodes 141 may be spaced apart from the corresponding first housing units A11 by a first distance d1. That is, the first electrodes 141 do not directly contact the encapsulation member 160 and upper surfaces and sides of the first electrodes 141 may be exposed to the outside. Accordingly, the first housing units A11 may expose an upper surface of the substrate 110. For example, each of the first housing units A11 may expose some portions of the first upper conductive pattern 113a. Alternatively, each of the first housing units A11 may expose some portions of the corresponding first upper conductive pattern 113a and some portions of the corresponding insulation body 111.

The upper surfaces of the first electrodes 141 may be disposed at a higher level than an upper surface of the encapsulation member 160 based on an upper surface of the substrate 110. Thus, a lower portion of a sidewall of the first electrodes 141 may be surrounded by the first housing units A11 (or by the encapsulation member 160). In this case, the lower portion of the sidewall of the first electrodes 141 (for example, the portion of the first electrodes 141 overlapping the encapsulation member 160) may face the first housing units A11.

In some embodiments, the upper surfaces of the first electrodes 141 may be disposed at a lower level than the upper surface of the encapsulation member 160 based on the upper surface of the substrate 110 or may be disposed at the same level as the upper surface of the encapsulation member 160. In this case, all sides of the first electrodes 141 may be surrounded by the corresponding first housing units A11. That is, all sides of the first electrodes 141 may face the first housing units A11.

The second housing units A2 may house the second electrodes 143, respectively. That is, the second electrodes 143 may be arranged within the second housing units A12 that are disposed on the substrate 110. In detail, the second electrodes 143, which are arranged within the second housing units A12, may be bonded to the fifth upper conductive pattern 113e by the first bonding member 121 interposed therebetween. Since the fifth upper conductive pattern 113e is arranged on the second semiconductor chip 133, the second electrodes 143 may transmit various signals transmitted by an external device to the second semiconductor chip 133.

The second electrodes 143 may have a pillar having a second width w2. In some embodiments, the second width w2 of the second electrodes 143 may be smaller than the first width w1 of the first electrodes 141. That is, when the first electrodes 141 function as power electrodes and the second electrodes 143 function as signal electrodes, the first width w1 and the second width w2 may be adjusted in consideration of a current rate.

The second electrodes 143 may have a closed cross-section on a top or bottom thereof, but is not limited thereto. The second electrodes 143 may be a polygonal pillar of which a vertical cross-section is a polygon, which is similar to the first electrodes 141. In addition, structures of the second electrodes 143 may be changed as the structures of the first electrodes 141 described with reference to FIGS. 1C to 1E change.

The second electrodes 143 may be spaced apart from the second housing units A12 corresponding to the second electrodes 143 by a second distance d2. That is, the second electrodes 143 do not directly contact the encapsulation member 160 and upper surfaces and sides of the second electrodes 143 may be exposed to the outside. Accordingly, the second housing units A12 may expose the upper surface of the substrate 110. For example, each of the second housing units A12 may expose some portions of the fifth upper conductive pattern 113e. Alternatively, each of the second housing units A12 may expose some portions of the fifth upper conductive pattern 113e together with some portions of the insulation body 111. The second distance d2 between each second electrode 143 and each second housing unit A12 may be smaller than the first distance d1 between each first electrode 141 and each first housing unit A11, but the inventive concept is not limited thereto. In other embodiments, the second distance d2 between each second electrode 143 and each second housing unit A12 may be substantially the same as the first distance d1 between each first electrode 141 and each first housing unit A11.

The upper surfaces of the second electrodes 143 may be disposed at a higher level than the upper surface of the encapsulation member 160 based on the upper surface of the substrate 110. Thus, a lower portion of a sidewall of the second electrodes 143 may be surrounded by the second housing unit A12 (or by the encapsulation member 160). In this case, the lower portion of the sidewall of the second electrodes 143 (for example, the portion of the second electrodes 143 overlapping with the encapsulation member 160) may face the second housing unit A12.

In some embodiments, the upper surfaces of the second electrodes 143 may be disposed at a lower level than the upper surface of the encapsulation member 160 based on the upper surface of the substrate 110 or may be disposed at the same level as the upper surface of the encapsulation member 160. In this case, all sides of the second electrodes 143 may be surrounded by the corresponding second housing units A12. That is, all sides of the second electrodes 143 may face the second housing units A12.

In FIGS. 1A and 1B, the upper surfaces of the second electrodes 143 are disposed at the same level as those of the first electrodes 141, but are not limited thereto. The upper surfaces of the second electrodes 143 may be disposed at a higher or lower level than those of the first electrodes 141 based on the upper surface of the substrate 110.

The power module package 10_1 has a structure in which the first and second electrodes 141 and 143 corresponding to the first and second housing units A11 and A12, which are the areas that penetrate the encapsulation layer 160, are spaced apart from the encapsulation layer 160.

Based on the above structure, the first and second electrodes 141 and 143 do not directly contact a top mold die (TMD) (referring to FIGS. 2E and 2F), and thus, damage to the first and second electrodes 141 and 143, which may be caused while manufacturing the power module package 10_1, may be fundamentally prevented, thereby improving the reliability of the power module package 10_1. In addition, the power module package 10_1 has a structure in which the first and second electrodes 141 and 143 are directly arranged on the substrate 110 without lead frames such that the power module package 10_1 may have a simplified structure, be small in size, and be lightweight.

Fillers (not shown) may exist in the first housing units A11 housing the first electrodes 141 and/or the second housing units A12 housing the second electrodes 143. The fillers may partially or fully fill areas in the first housing units A11 other than an area where the first electrodes 141 are disposed. The fillers may partially or fully fill areas in the second housing units A12 other than an area where the second electrodes 143 are disposed.

The fillers may partially or fully fill gaps between the first electrodes 141 and the encapsulation member 160 or gaps between the second electrodes 143 and the encapsulation member 160. The fillers may contact some of the sides of the first electrodes 141 or the second electrodes 143.

The fillers are separately formed and may be injected into the first housing units A11 and/or the second housing units A12. Alternatively, the fillers are injected into the first housing units A11 and/or the second housing units A12 in a liquid form and may be hardened.

FIGS. 2A through 2G are cross-sectional views illustrating a method of manufacturing the power module package 1O_1 of FIG. 1A. Like reference numerals in the drawings denote like elements, and thus their descriptions will be omitted for convenience of explanation.

Figure 2A:
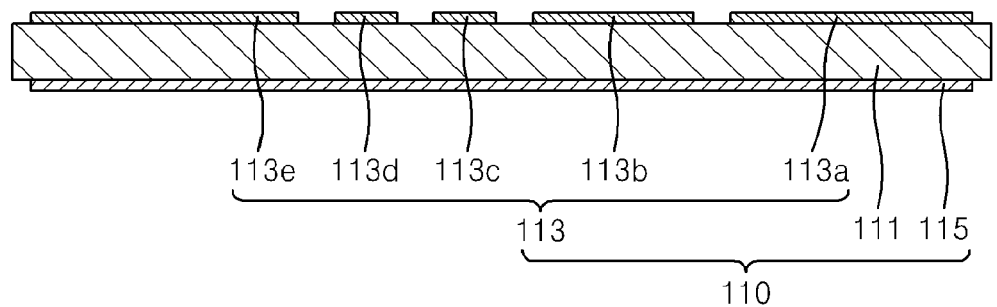
FIGS. 2A through 2G are cross-sectional views illustrating a method of manufacturing the power module package of FIG. 1A.

Referring to FIG. 2A, the substrate 110 having the insulation body 111 is provided. The first to fifth upper conductive patterns 113a to 113e may be formed on an upper surface of the insulation body 111, and the lower conductive pattern 115 may be formed on a lower surface of the insulation body 111.

Figure 2B:
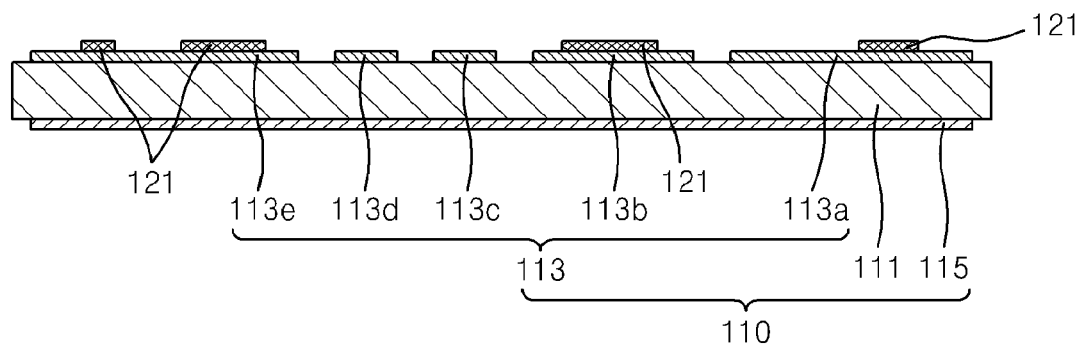

Referring to FIG. 2B, the first bonding members 121 may be formed on portions of the first to fifth upper conductive patterns 113a to 113e on which the first and second semiconductor chips 131 and 133 and the first and second electrodes 141 and 143 will be arranged in a subsequent process. The first bonding members 121 may be formed of, for example, solders or conductive adhesive materials such as epoxy including metal ingredients. The first bonding members 121 may be formed by a dotting method, a screen printing method, a dispensing method, or the like.

Figure 2C:
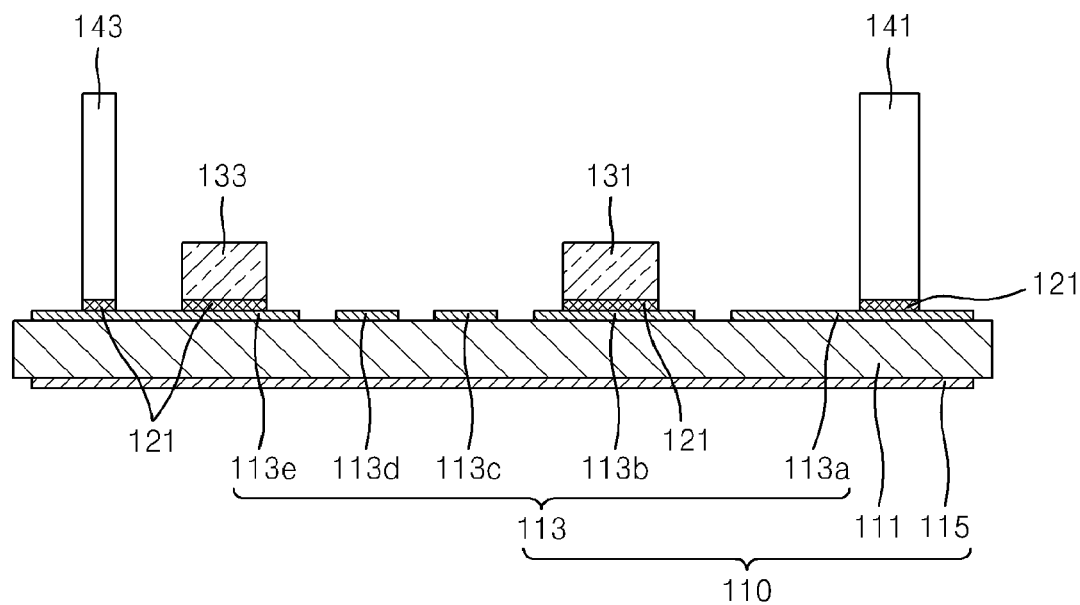

Referring to FIG. 2C, the first and second semiconductor chips 131 and 133 and the first and second electrodes 141 and 143 are arranged on the first bonding members 121 by using an auto component mounter (not shown). In particular, one of the first electrodes 141 is arranged on the first bonding member 121 that is arranged on the first upper conductive pattern 113a, the first semiconductor chip 131 is arranged on the first bonding member 121 that is arranged on the second upper conductive pattern 113b, and the second semiconductor chip 133 and one of the second electrodes 143 are arranged on the first bonding member 121 that is arranged on the fifth upper conductive pattern 113e.

Then, by performing a reflow process, one of the first electrodes 141 may be bonded to the first upper conductive pattern 113a, the first semiconductor chip 131 may be bonded to the second upper conductive pattern 113b, and the second semiconductor chip 133 and one of the second electrodes 143 may be bonded to the fifth upper conductive pattern 113e. In this case, the second semiconductor chip 133 and the second electrode 143 that are arranged on the fifth upper conductive pattern 113e are electrically connected to each other.

Although not illustrated, in a case where the first and second semiconductor chips 131 and 133 are bonded to the corresponding second and fifth upper conductive pattern 113b and 113e by using an adhesive material such as an adhesive tape, a bonding process may be performed in a different manner.

For example, as shown in FIGS. 2B and 2C, after the first and second electrodes 141 and 143 are bonded to the corresponding first and fifth upper conductive pattern 113a and 113e, the first and second semiconductor chips 131 and 133 to which the adhesive tape adheres may be bonded to the first and fifth upper conductive pattern 113a and 113e. In other embodiments, after the first and second semiconductor chips 131 and 133 to which the adhesive tape adheres are bonded to the first and fifth upper conductive pattern 113a and 113e, and the first and second electrodes 141 and 143 may be bonded to the corresponding first and fifth upper conductive pattern 113a and 113e.

Although not illustrated, a cleaning process for removing residues of the first bonding members 121 that remain on the substrate 110 may be performed.

Figure 2D:
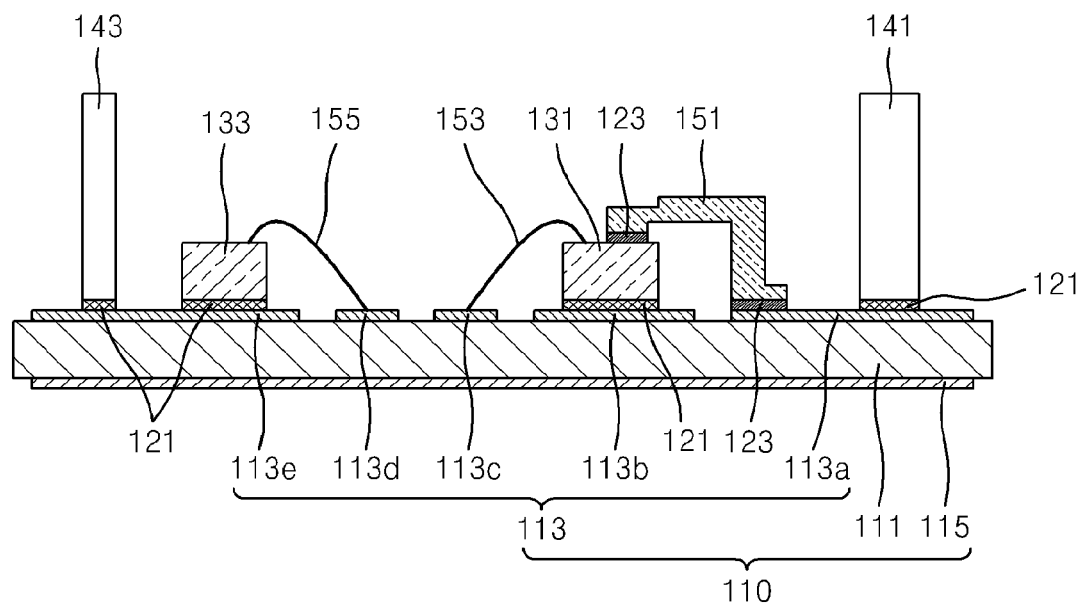

Referring to FIG. 2D, the second bonding member 123 may be formed on a portion of the first upper conductive pattern 113a and a portion of the first semiconductor chip 131, and the first wiring member 151 may be arranged on the second bonding member 123. For example, one end of the first wiring member 151 may be positioned on the portion of the first upper conductive pattern 113a, and the other end of the first wiring member 151 may be positioned on the portion of the first semiconductor chip 131. Then, the first wiring member 151 may be attached to the portion of the first upper conductive pattern 113a and the portion of the first semiconductor chip 131 through a reflow process. Thus, the first semiconductor chip 131 may be electrically connected to the first upper conductive pattern 113a via the first wiring member 151 and the second bonding member 123. Accordingly, the first semiconductor chip 131 and the first electrodes 141 on the first upper conductive pattern 113a may be electrically connected.

The second and third wiring members 153 and 155 may be formed through a wire bonding process so as to electrically connect the first semiconductor chip 131 to the third upper conductive pattern 113c and electrically connect the second semiconductor chip 133 to the fourth upper conductive pattern 113d.

Figure 2E:
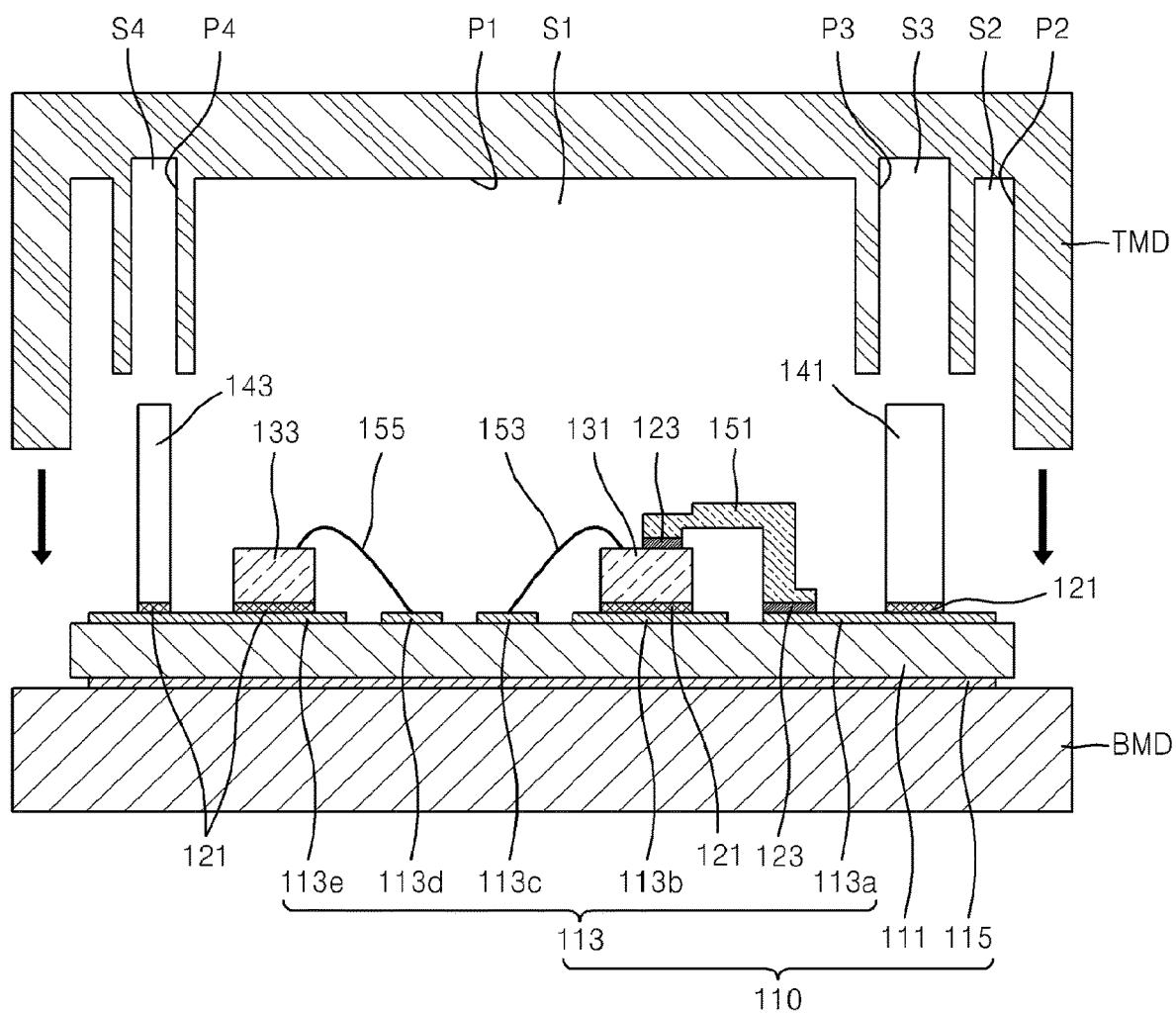
Figure 2F:
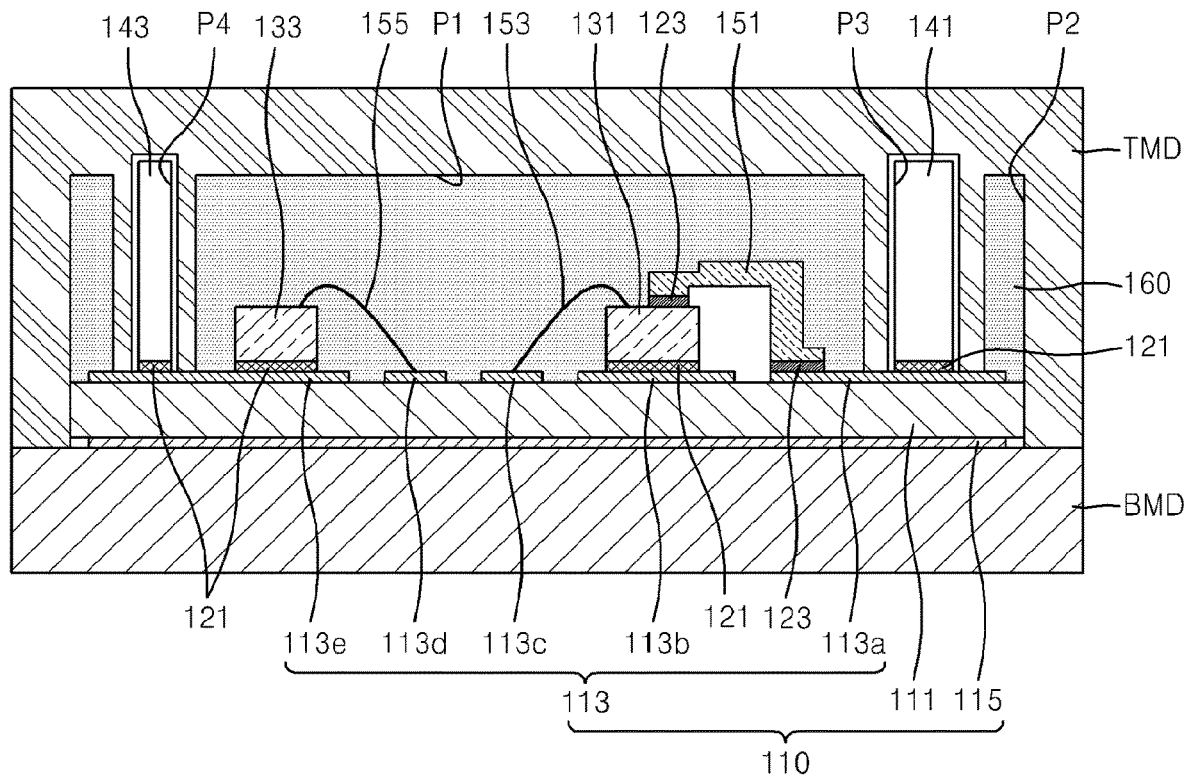

Referring to FIGS. 2E and 2F, the substrate, on which the first and second semiconductor chips 131 and 133, the first and second electrodes 141 and 143 and the first to third wiring members 151, 153 and 155 are formed, may be mounted on a bottom mold die (BMD), and then the TMD may be attached to the upper surface of the substrate 110. Encapsulation materials such as epoxy mold compound may be injected into a space defined by the TMD and hardened to form the encapsulation member 160. That is, the encapsulation member 160 may be formed by performing a transfer molding process.

The TMD may include a first part P1, a second part P2, a third part P3, and a fourth part P4. The first part P1 may define a first space S1 capable of housing the first and second semiconductor chips 131 and 133, and the first to third wiring members 151, 153 and 155, a second part P2 may define a second space S2 at an edge of the substrate 110, a third part P3 may define a third space S3 capable of housing the first electrodes 141, and a fourth part P4 may define a fourth space S4 capable of housing the second electrodes 143.

The third and fourth parts P3 and P4 may have shapes corresponding to the first and second housing units A11 and A12, respectively.

The third and fourth parts P3 and P4 may have depths greater than those of the first and second parts P1 and P2 based on the upper surface of the substrate 110.

The third and fourth parts P3 and P4 may respectively have widths greater than the first and second widths w1 and w2 of the first and second electrodes 141 and 143. That is, widths of the third and fourth spaces S3 and S4 defined by the third and fourth parts P3 and P4 may be greater than those of the first and second widths w1 and w2 of the first and second electrodes 141 and 143.

The widths of the third and fourth spaces S3 and S4 defined by the third and fourth parts P3 and P4 may be the same, but are not limited thereto. The widths of the third and fourth spaces S3 and S4 defined by the third and fourth parts P3 and P4 may be different from each other.

When performing the transfer molding process, the first and second spaces S1 and S2 defined by the first and second parts P1 and P2 may be filled with the encapsulation materials, and the third and fourth spaces S3 and S4 defined by the third and fourth parts P3 and P4 may not be filled with the encapsulation materials.

Accordingly, the encapsulation member 160 covers at least some portions of the substrate 110, the first and second semiconductor chips 131 and 133, and the first to third wiring members 151, 153 and 155 and includes the first and second housing units A11 and A12 housing the first and second electrodes 141 and 143.

As described above, as the TMD does not directly contact the first and second electrodes 141 and 143 when performing the transfer molding process, the damage to the first and second electrodes 141 and 143 may be prevented.

Figure 2G:
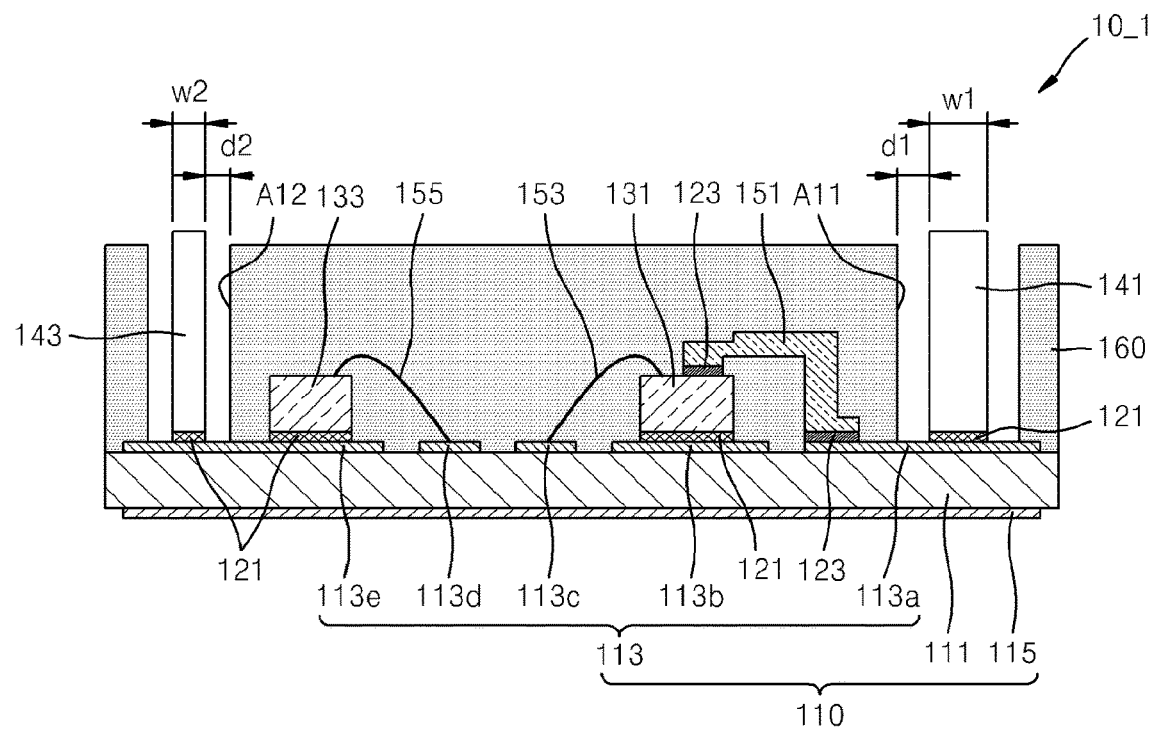

Referring to FIG. 2G, the power module package 10_1 is formed by removing the BMD and the TMD.

Although not illustrated, cleaning, plating, testing and packing processes with regard to the power module package 10_1 may be performed.

Figure 3:
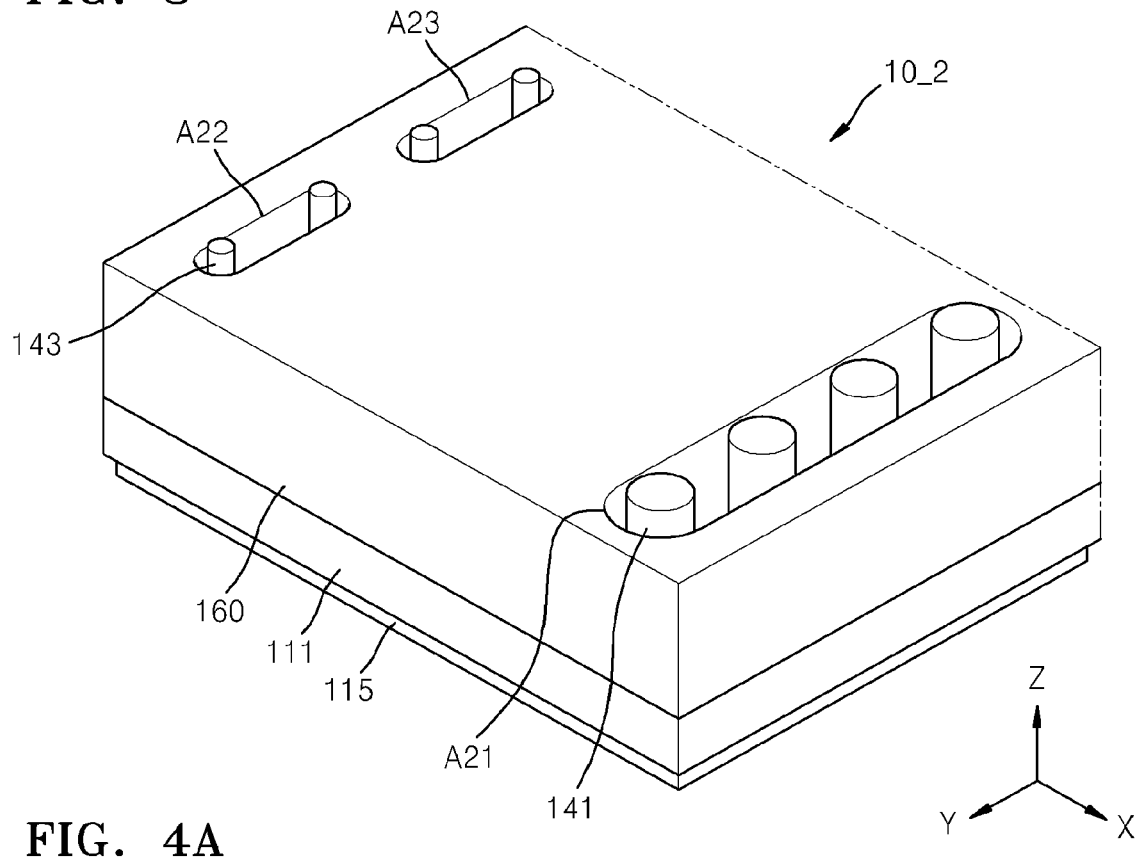
FIG. 3 is a schematic perspective view of a portion of a power module package according to an embodiment of the inventive concept.

FIG. 3 is a diagram of a power module package 10_2 according to a modified embodiment of the inventive concept. When describing FIG. 3, like reference numerals in the drawings denote like elements. For convenience of explanation, repeated descriptions thereof will be omitted and a difference between FIGS. 1A and 1B and 3 will be mainly described.

Referring to FIG. 3, the power module package 10_2 may include an encapsulation member 160 in which third to fifth housing units A21, A22 and A23 are formed. Unlike the first and second housing units A11 and A12 shown in FIGS. 1A and 1B, each of the third to fifth housing units A21, A22 and A23 has closed cross-sections extending in a Y direction and may include two or more electrodes. For example, two or more first electrodes 141, of which upper surfaces and sides are exposed, are arranged in the third housing unit A21 and two or more second electrodes 143 may be arranged in the fourth and fifth housing units A22 and A23.

As described above, the first and second housing units A11 and A12 may include a plurality of electrodes as the third to fifth housing units A21 to A23 by varying sizes of the first and second housing units A11 and A12 according to necessity. Thus, the damage to the first and second electrodes 141 and 143 may be effectively prevented even though semiconductor chips and electrodes are highly integrated.

Figure 4A:
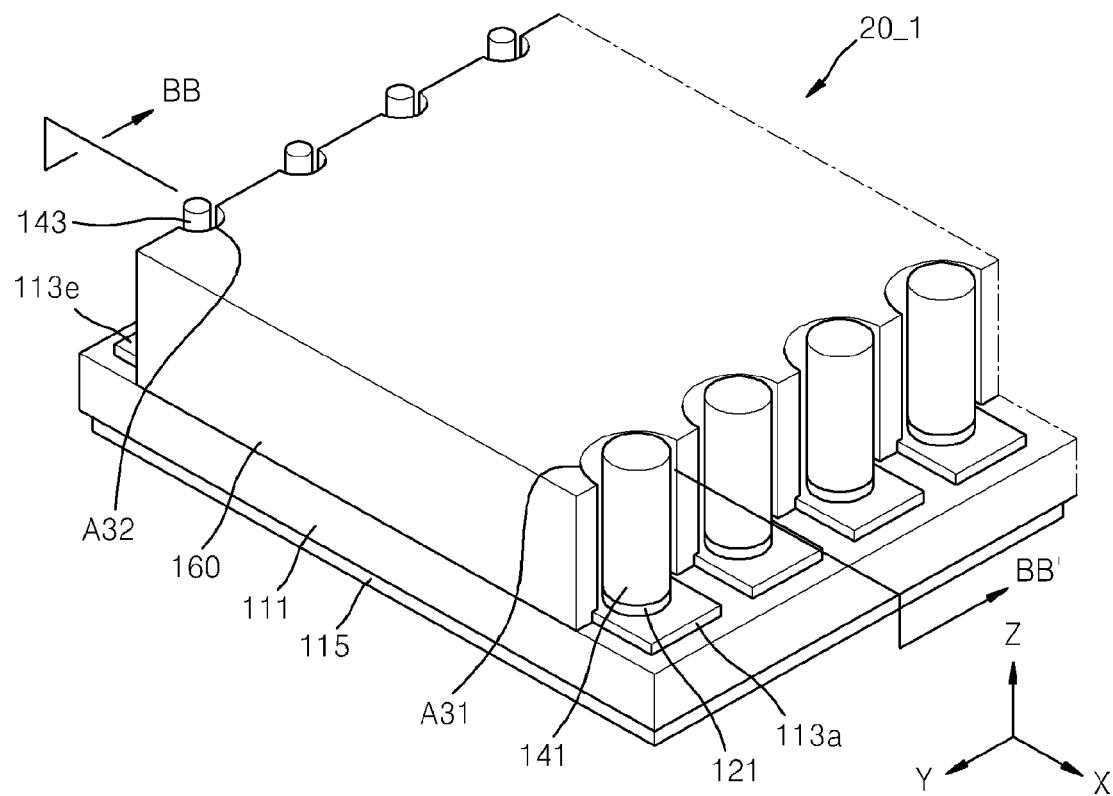
FIG. 4A is a schematic perspective view of a portion of a power module package, according to an embodiment of the inventive concept.
Figure 4B:
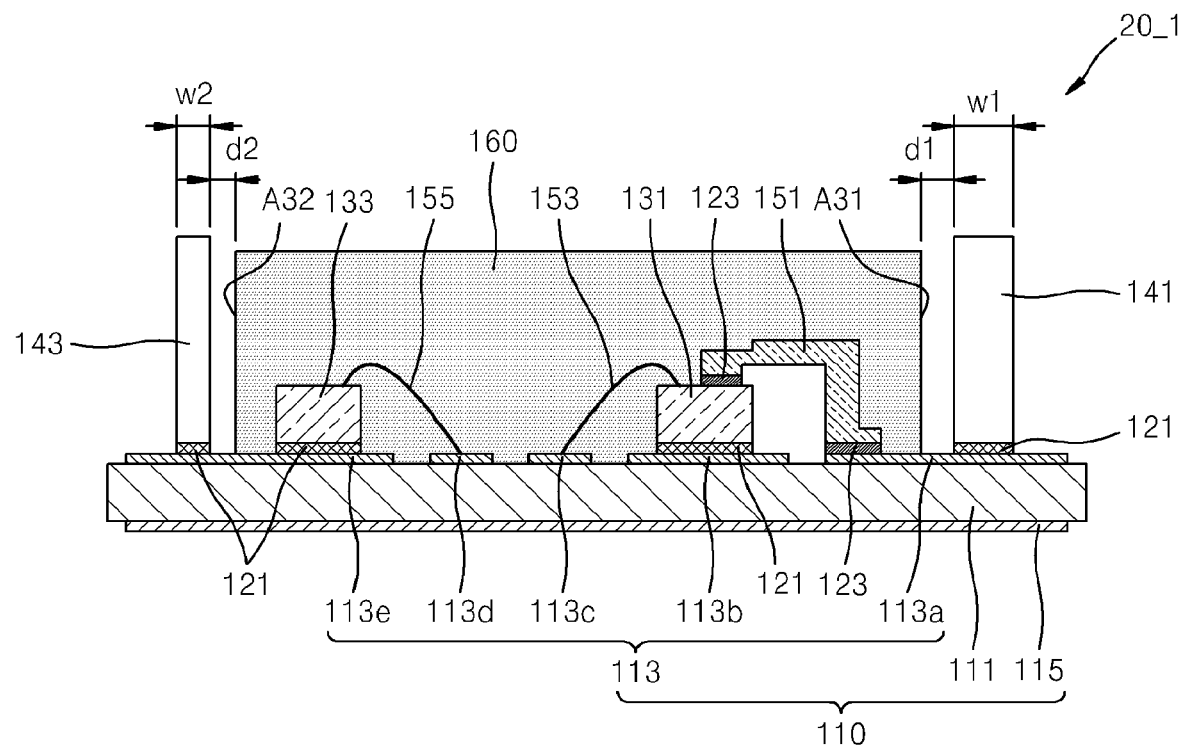
FIG. 4B is a cross-sectional view of some components of the power module package, taken along a line BB-BB' of FIG. 4A.

FIG. 4A is a schematic perspective view of a portion of a power module package 20_1, according to an embodiment of the inventive concept, FIG. 4B is a cross-sectional view of some components of the power module package 20_1, taken along a line BB-BB' of FIG. 4A, and FIGS. 4C to 4E are plan views of structures of a first electrode 141 and a sixth housing part A31. When describing FIGS. 4A to 4E, like reference numerals in the drawings denote like elements. For convenience of explanation, repeated descriptions thereof will be omitted and a difference between FIGS. 1A and 1B and FIGS. 4A to 4E will be mainly described.

Referring to FIGS. 4A and 4B, the power module package 20_1 may not cover edges of the substrate 110 and cover areas where the first and second semiconductor chips 131 and 133 and the first to third wiring members 151, 153 and 155 are formed. In addition, the power module package 20_1 may include an encapsulation member 160 including sixth and seventh housing units A31 and A32.

The sixth and seventh housing units A31 and A32 may respective denote an area where the first electrodes 141 are housed and an area where the second electrodes 143 are housed. Also, the sixth and seventh housing units A31 and A32 may be parts defining grooves extending in a Z direction from one side of the encapsulation member 160. That is, the sixth and seventh housing units A31 and A32 may be concave areas heading to a center of the substrate 110 in an X direction from a side of the encapsulation member 160.

Each of the sixth and seventh housing units A31 and A32 may have an open cross-section in the Z direction. For example, the sixth and seventh housing units A31 and A32 may have a semicircular shape of which a vertical cross-section is open in the Z direction. However, the inventive concept is not limited thereto, and the sixth and seventh housing unit A31 and A32 may have an open polygonal shape in the Z direction.

The sixth housing units A31 may include the first electrodes 141, respectively. That is, the first electrodes 141 may be disposed within the sixth housing units A31 of the substrate 110. In this case, one side of each of the first electrodes 141 may face each of the sixth housing units A31 by having a first distance d1, and another side of each of the first electrodes 141 may not face an internal wall of each of the sixth housing units A31.

Structures of sixth housing units A31 corresponding to first electrodes 141 will be further described with reference to FIGS. 4C to 4E, and a case where a cross-section of each of the first electrodes 141 and that of each of the sixth housing units A31 are a circle will be described.

Figure 4C:
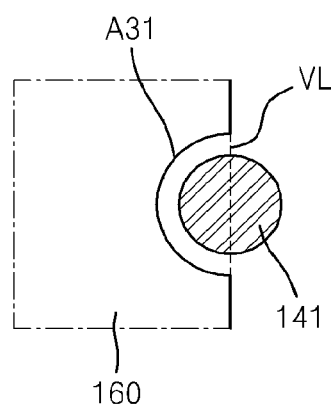
FIGS. 4C to 4E are plan views of structures of a first electrode and a sixth housing part.

Referring to FIG. 4C, when two portions of the encapsulation member 160 positioned at both sides of the sixth housing units A31 are connected to each other through an extension line VL, the cross-section of the first electrode 141 may cross the extension line VL. In some embodiments, the cross-section of first electrode 141 may have a symmetrical shape with respect to the extension line VL as shown in FIG. 4C. For example, the extension line VL may intersect with a center of the cross-section of the first electrode 141. In this case, half the area of the sidewall of the first electrode 141 may be surrounded by the encapsulation member 160 (for example, in the sixth housing units A31), and the other half thereof may be exposed outside the encapsulation member 160.

Figure 4D:
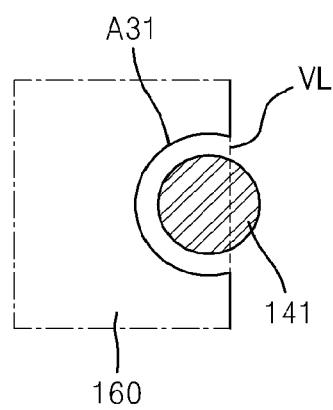
Figure 4E:
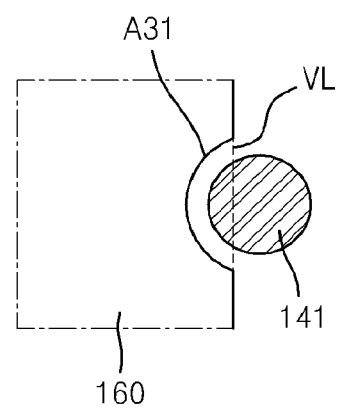

Referring to FIGS. 4D and 4E, the cross-section of the first electrode 141 may cross the extension line VL, and the extension line VL may not intersect with a center of the cross-section of the first electrode 141. For example, the extension line VL may deviate from the center of the cross-section of the first electrode 141. As shown in FIG. 4D, the sixth housing unit A31 may surround a greater portion of the cross-section of the first electrode 141. For example, more than half the area of the sidewall of the first electrode 141 may be surrounded by the encapsulation member 160 (for example, in the sixth housing units A31). Alternatively, as shown in FIG. 4E, the sixth housing unit A31 may surround a smaller portion of the cross-section of the first electrode 141. For example, less than half the area of the sidewall of the first electrode 141 may be surrounded by the encapsulation member 160.

Referring back to FIGS. 4A and 4B, the seventh housing units A32 may house the second electrodes 143, respectively. That is, the second electrodes 143 may be arranged in the seventh housing units A32 disposed on the substrate 110. In this case, a side of each second electrode 143 may face each seventh housing unit A32 by having the second distance d2, and another side of each second electrode 143 may not face each seventh housing unit A32. Structures of the seventh housing units A32 corresponding to the second electrodes 143 may be changed as the structures of the sixth housing units A31 corresponding to the first electrodes 141.

The power module package 20_1 may prevent the damage to the first and second electrodes 141 and 143 according to substantially the same principle as in the power module package 10_1 shown in FIGS. 1A and 1B, thereby reducing a possibility of malfunction and improving manufacturing yields.

Also, in the case of the power module package 20_1, the encapsulation member 160 may be formed not to cover the edges of the substrate 110 from sides of the first and second electrodes 141 and 143 so as to make the sixth and seventh housing units A31 and A32 have open cross-sections. The TMD may not include the second part P2 defining the second space S2 of the substrate 110, and thus, a compact package may be obtained and manufacturing costs may be reduced.

Figure 5:
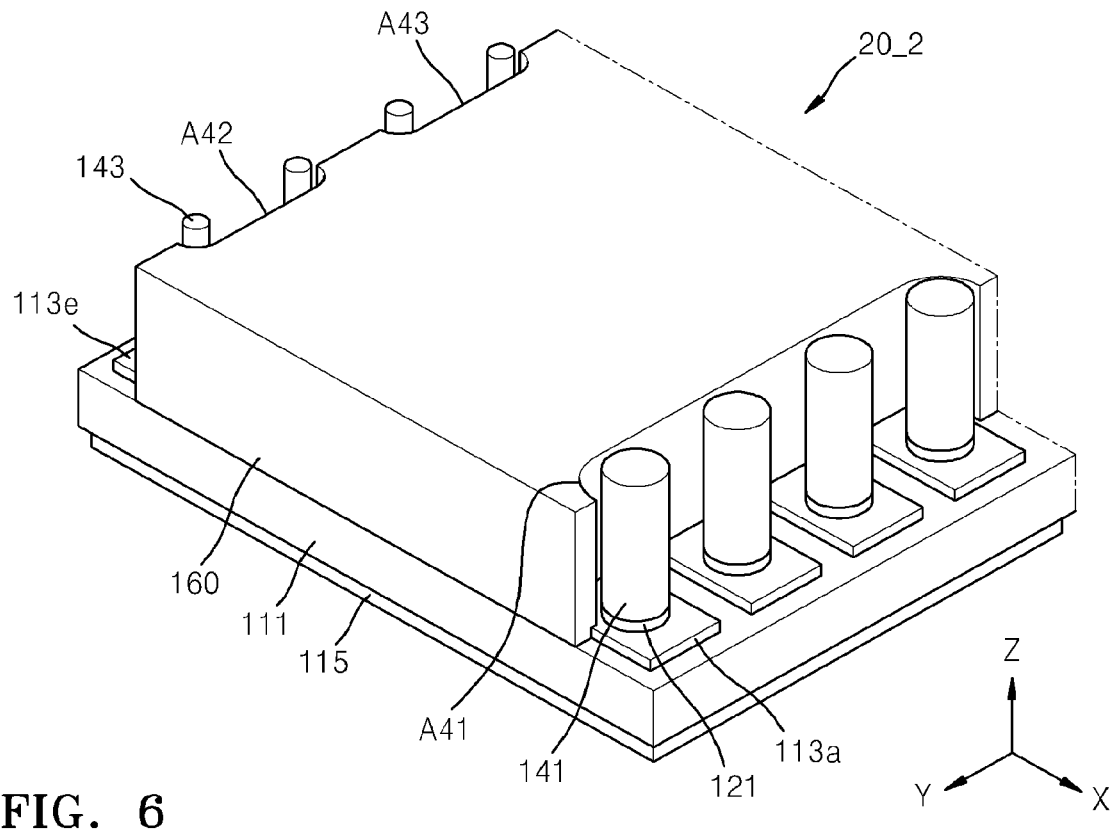
FIG. 5 is a schematic perspective view of a portion of a power module package according to an embodiment of the inventive concept.

FIG. 5 is a schematic perspective view of a portion of a power module package 20_2 according to an embodiment of the inventive concept. When describing FIG. 5, like reference numerals in the drawings denote like elements. For convenience of explanation, repeated descriptions thereof will be omitted and a difference between FIGS. 4A and 4B and FIG. 5 will be mainly described.

Referring to FIG. 5, the power module package 20_2 may include an encapsulation member 160 in which eighth to tenth housing units A41 to A43 are formed. Unlike the sixth to seventh housing units A21 and A22 shown in FIGS. 4A and 4B, the eighth to tenth housing units A41 to A43 have open cross-sections extending in a Y direction and may include portions of two or more electrodes disposed therein. For example, two or more first electrodes 141 exposing upper surfaces and sides thereof may be arranged in the eighth housing units A21, and two or more second electrodes 143 may be arranged in the ninth and tenth housing units A42 and A43.

As described above, although semiconductor chips and electrodes are highly integrated, the damage to the electrodes may be effectively prevented by changing sizes of the sixth and seventh housing unit A31 and A32 shown in FIGS. 4A and 4B and making the sixth and seventh housing unit A31 and A32 respectively surround electrodes as the eighth to tenth housing units A41 to A43.

Figure 6:
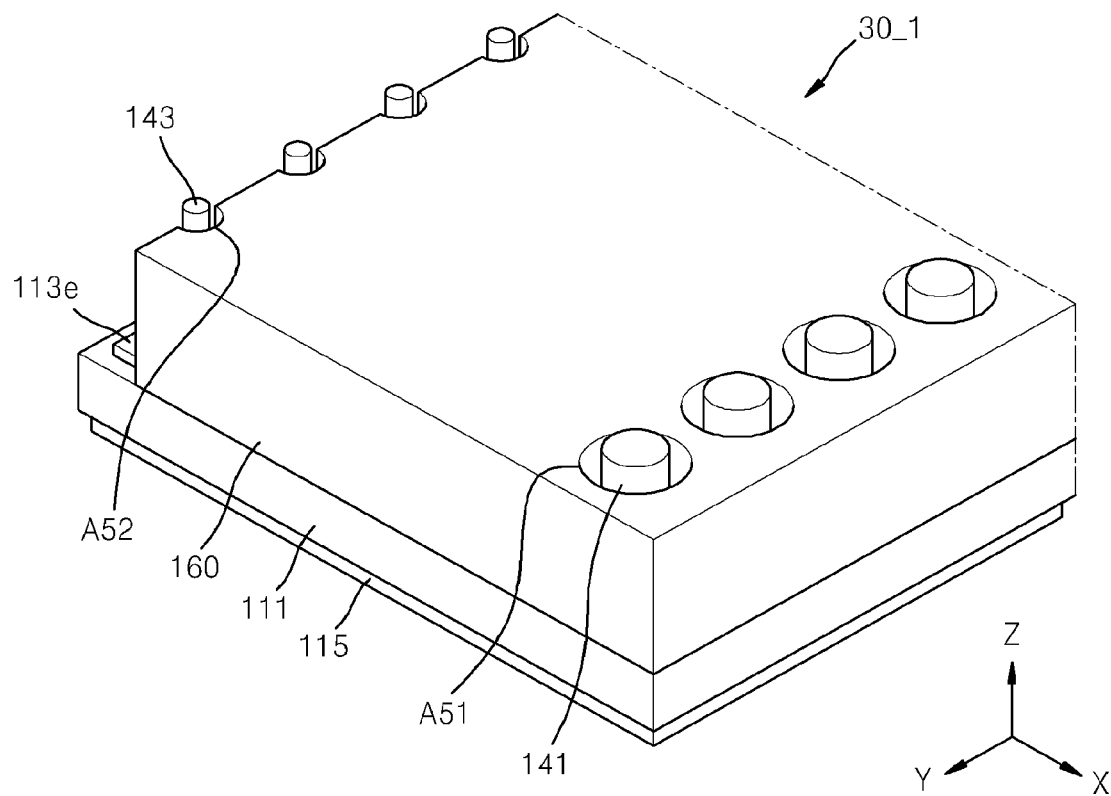
FIG. 6 is a schematic perspective view of a portion of a power module package according to an embodiment of the inventive concept.
Figure 7:
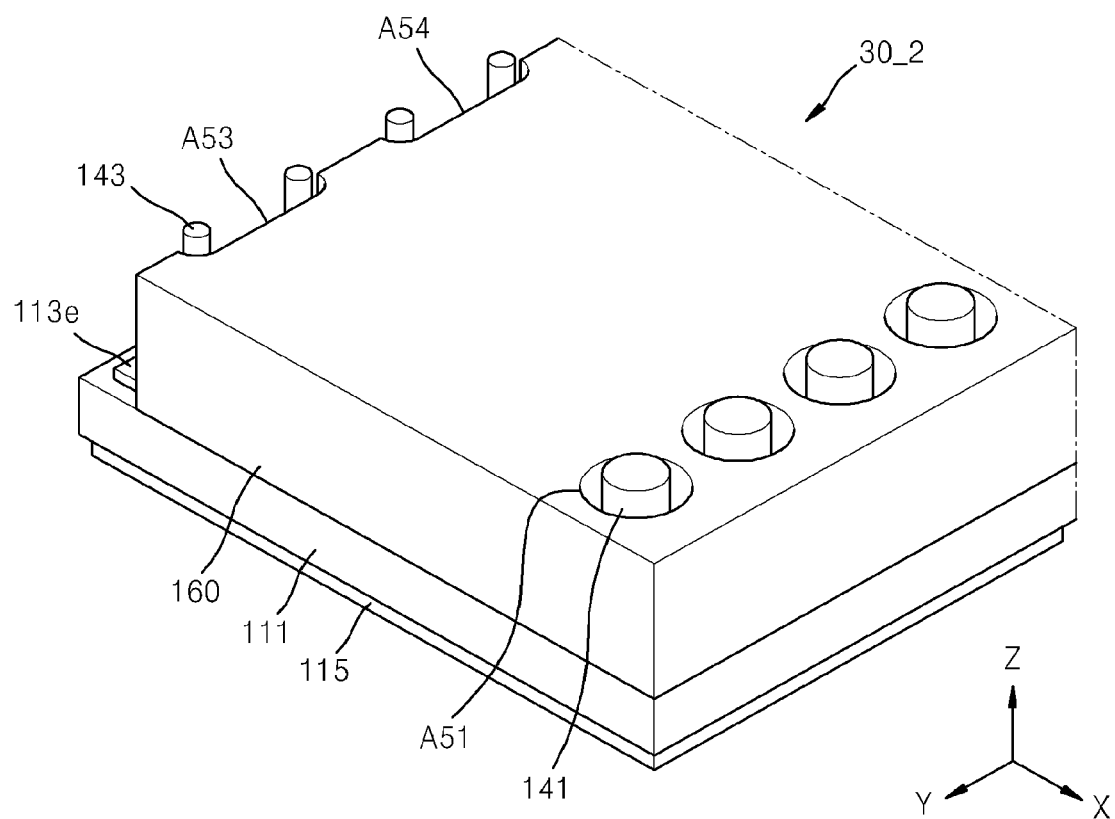
FIG. 7 is a schematic perspective view of a portion of a power module package according to an embodiment of the inventive concept.

FIG. 6 is a schematic perspective view of a portion of a power module package 30_1, according to an embodiment of the inventive concept, and FIG. 7 is a diagram of a power module package 30_2 according to an embodiment of the inventive concept. When describing FIGS. 6 and 7, like reference numerals in the drawings denote like elements. For convenience of explanation, repeated descriptions thereof will be omitted and a difference between FIGS. 1A to 5 and FIGS. 6 and 7 will be mainly described.

Referring to FIG. 6, the power module package 30_1 may include an encapsulation member 160 including eleventh housing units A51 corresponding to the first housing units A11 shown in FIGS. 1A and 1B and twelfth housing units A52 corresponding to the seventh housing unit A32 shown in FIGS. 4A and 4B.

That is, the first electrodes 141 are arranged in the eleventh housing units A51 having closed cross-sections in a Z direction, and the second electrodes 143 may be arranged in the twelfth housing units A52 having open cross-sections in a Z direction. On the contrary, the first electrodes 141 are arranged in housing units (refer to the sixth housing units A31 of FIGS. 4A and 4B) having open cross-sections in a Z direction, and the second electrodes 143 may be arranged in housing units (refer to the second housing units A12 of FIGS. 1A and 1B) having closed cross-sections in a Z direction.

Referring to FIG. 7, the power module package 30_2 shows a case where the twelfth housing units A52 of the power module package 30_1 of FIG. 6, which house the second electrodes 143, are changed to thirteenth and fourteenth housing units A53 and A54 due to a greater size.

In the power module package 30_2, the eleventh housing units A51 may have a different size to include the first electrodes 141 (refer to the third housing units A21 of FIG. 3).

Figure 8A:
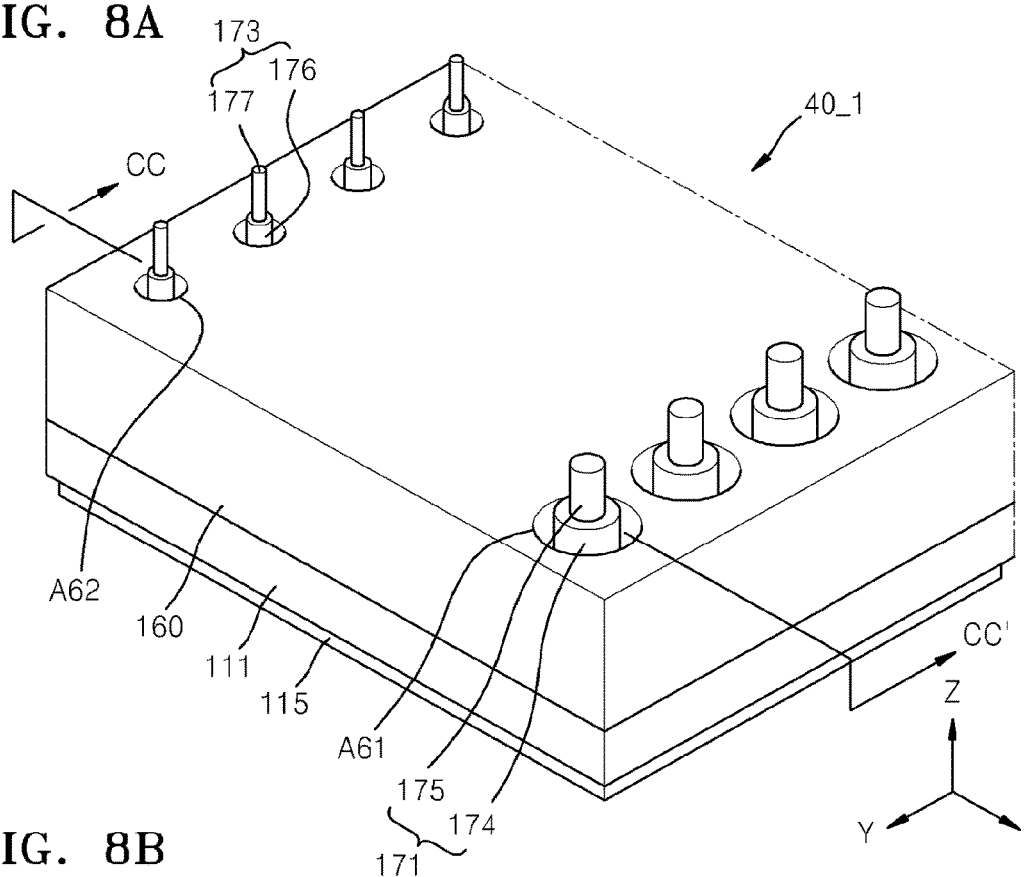
FIG. 8A is a schematic perspective view of a portion of a power module package, according to an embodiment of the inventive concept.
Figure 8B:
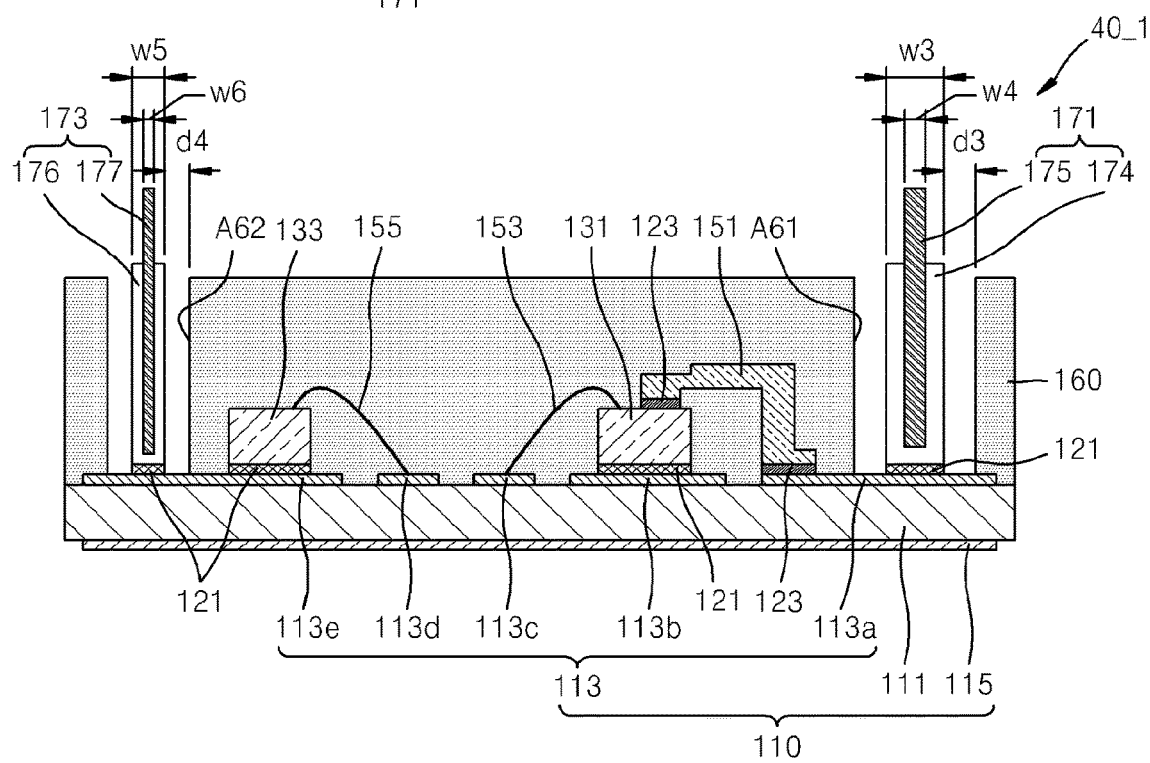
FIG. 8B is a cross-sectional view of some components of a power module package taken along a line CC-CC' of FIG. 8A.

FIG. 8A is a schematic perspective view of a portion of a power module package 40_1, according to another embodiment of the inventive concept, FIG. 8B is a cross-sectional view of some components of the power module package 40_1, taken along a line CC-CC' of FIG. 8A, and FIGS. 8C to 8F are cross-sectional views of structures of a third electrode 171 of FIG. 8A. When describing FIGS. 8A and 8B, like reference numerals in the drawings denote like elements. For convenience of explanation, repeated descriptions thereof will be omitted and a difference between FIGS. 1A and 1B and FIGS. 8A and 8B will be mainly described.

Referring to FIGS. 8A and 8B, the power module package 40_1 includes an encapsulation member 160 including fifteenth and sixteenth housing units A61 and A62 that are similar to the first and second housing units A11 and A12 included in the power module package 1O_1 of FIGS. 1A and 1B, and the fifteenth and sixteenth housing units A61 and A62 may house third and fourth electrodes 171 and 173.

The third electrodes 171 may be spaced apart from the fifteenth housing units A61 by a third distance d3, and the fourth electrodes 173 may be spaced apart from the sixteenth housing units A62 by a fourth distance d4 that is smaller than the third distance d3. However, the inventive concept is not limited thereto, and the third distance d3 may be substantially the same as the fourth distance d4.

One of the third electrodes 171 may be bonded to the first upper conductive pattern 113a disposed on the upper surface of the substrate 110 by the first bonding member 121 interposed therebetween and may include a socket member 174 and a pin member 175 inserted into the socket member 174 and having a fourth width w4 that is smaller than a third width w3.

Structures of the socket member 174 will be further described with reference to FIGS. 8C to 8F.

Figure 8C:
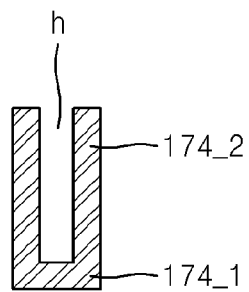
FIGS. 8C to 8F are cross-sectional views of structures of a third electrode of FIG. 8A.

Referring to FIG. 8C, the socket member 174 may extend in a Z direction from a base unit 174_1 contacting the upper conductive patterns 113 and may include a body unit 174_2 defining a hole h in which the pin member 175 is inserted. In some embodiments, the hole h may be defined as a space formed by a sidewall of the body unit 174_2 and an upper surface of the base unit 174_1. In some embodiments, the socket member 174 may have a cylindrical shape having a closed bottom (or a cup shape). In some embodiments, the body unit 174_2 may have a width substantially the same as that of the base unit 174)1, but the inventive concept is not limited thereto.

Figure 8D:
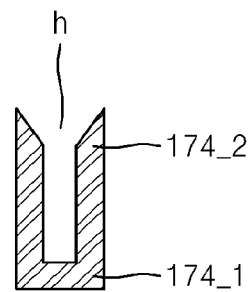

Referring to FIG. 8D, the socket member 174 may have a structure in which an upper portion of the body unit 174_2 is inclined towards a center of the hole h.

Figure 8E:
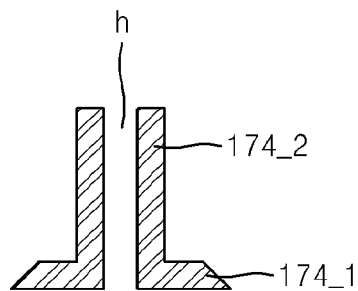

Referring to FIG. 8E, the socket member 174 may have a structure in which the base unit 174_1 has a width greater than that of the body unit 174_2. In some embodiments, the hole h may be defined as a space formed by a sidewall of the body unit 174_2 and a sidewall of the base unit 174_1. The hole h may extend to a bottom portion of the base unit 174_1, and the hole h may penetrate the socket member 174.

Figure 8F:
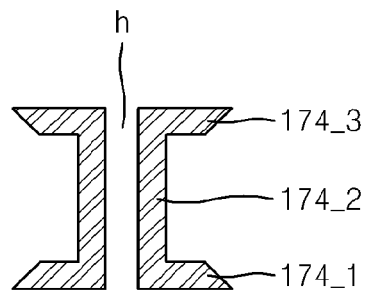

Referring to FIG. 8F, the socket member 174 may further include a solder unit 174_3 disposed on the body unit 174_2. In FIG. 8F, a width of the solder unit 174_3 is substantially the same as that of the base unit 174_1, but is not limited thereto. The width of the solder unit 174_3 may be smaller or greater than that of the base unit 174_1. Hereinafter, a case where the socket member 174 has the structure shown in FIG. 8C will be described for convenience of explanation.

The socket member 174 and the pin member 175 of the third electrode 171 may have a circular cross-section, but are not limited thereto. The socket member 174 and the pin member 175 of the third electrode 171 may have a polygonal cross-section. The pin member 175 may be a pillar having a certain fourth width w4, but is not limited thereto. The pin member 175 may have a pillar shape in which the fourth width w4 changes along the Z direction. Alternatively, the pin member 175 may have a shape in which an uppermost portion of the pin member 175 is annular.

The socket member 174 and the pin member 175 of the third electrode 171 may protrude to an upper surface of the encapsulation member 160 by extending in the Z direction. That is, heights of the socket member 174 and the pin member 175 may be greater than a thickness of the encapsulation member 160 in the Z direction. However, the inventive concept is not limited thereto. The socket member 174 may have a height that is the same as or smaller than the thickness of the encapsulation member 160 in the Z direction.

One of the fourth electrode 173 may be bonded to the fifth upper conductive pattern 113e disposed on the upper surface of the substrate 110 by the first bonding member 121 interposed therebetween and may include a socket member 176 having a fifth width w5 and a pin member 177 inserted into the socket member 176 and having a sixth width w6 smaller than the fifth width w5. The socket member 176 and the pin member 177 of the fourth electrode 173 may be substantially the same as the socket member 174 and the pin member 175 of the third electrode 171 other than the widths in the X direction.

The power module package 40_1 may prevent the damage to the third and fourth electrodes 171 and 173 according to substantially the same principle as that applied to the power module package 1O_1 shown in FIGS. 1A and 1B, thereby reducing a possibility of malfunction and improving manufacturing yields.

Although not illustrated, the fifteenth housing units A61 of the power module package 40_1 may be changed as the third housing units A21 of FIG. 3 change, the sixth housing units A31 of FIG. 4A, and the eighth housing units A41 of FIG. 5. The sixteenth housing units A62 of the power module package 40_1 may be changed as the fourth housing units A22 of FIG. 3 change, the seventh housing units A32 of FIG. 4A, and the ninth housing units A42 of FIG. 5.

Although not illustrated, as shown in the power module packages 30_1 and 30_2, the power module package 40_1 may have a structure in which holes having closed and open cross-sections are included and electrodes are housed in the holes.

It should be understood that the exemplary embodiments described therein should be considered in a descriptive sense only and not for purposes of limitation. Descriptions of features or aspects within each embodiment should typically be considered as available for other similar features or aspects in other embodiments.

While one or more embodiments of the inventive concept have been described with reference to the figures, it will be understood by those of ordinary skill in the art that various changes in form and details may be made therein without departing from the spirit and scope of the inventive concept as defined by the following claims.

What is claimed is:

1. A method comprising:
 coupling a semiconductor chip with a substrate;
 coupling an electrode with the substrate;
 mounting the substrate on a bottom mold die and connecting the bottom mold die to a top mold die, the top mold die:
  defining a first space and a second space, the second space being separated from the first space,
  the first space housing the semiconductor chip and, at least partially, surrounding a perimeter the second space, and
  the second space housing the electrode; and
 injecting an encapsulation material, such that the encapsulation material is injected into the first space and excluded from the second space,
 the injected encapsulation material forming an encapsulation member coupled to and covering at least a portion of the substrate, the encapsulation member including a housing unit housing the electrode,
 the electrode having a conductive sidewall exposed to, and not in contact with the encapsulation member, such that there is open space between the conductive sidewall of the electrode and the encapsulation member from an uppermost surface to a bottommost surface of the encapsulation member, the substrate having a portion exposed within the open space, the encapsulation member having an open cross-section perpendicular to an upper surface of the substrate and aligned along an extension line intersecting the electrode.

2. The method of claim 1, further comprising, prior to connecting the bottom mold die to the top mold die, forming a wiring member electrically connecting the semiconductor chip with the electrode.

3. The method of claim 2, wherein the wiring member is housed within the first space and encapsulated within the encapsulation material.

4. The method of claim 2, wherein forming the wiring member includes:
coupling the wiring member with the semiconductor chip via a first bonding member; and
coupling the wiring member with the substrate via a second bonding member.

5. The method of claim 1, further comprising, prior to coupling the semiconductor chip with the substrate, disposing a bonding member on the substrate, the semiconductor chip being coupled to the substrate via the bonding member.

6. The method of claim 1, further comprising, prior to coupling the electrode with the substrate, disposing a bonding member on the substrate, the electrode being coupled to the substrate via the bonding member.

7. The method of claim 1, wherein the second space has a depth in the top mold die that is, relative to an upper surface of the substrate, greater than a depth of the first space in the top mold die.

8. The method of claim 1, wherein the encapsulation member is formed such that the electrode has an exposed upper surface and an exposed portion of the conductive sidewall extending above the uppermost surface of the encapsulation member.

9. A method comprising:
coupling a semiconductor chip with a substrate;
coupling an electrode with the substrate;
forming a wiring member electrically coupling the semiconductor chip with the electrode;
mounting the substrate on a bottom mold die and connecting the bottom mold die to a top mold die, the top mold die:
defining a first space and a second space, the second space being separated from the first space,
the first space housing the semiconductor chip and completely surrounding a perimeter of the second space, and
the second space housing the electrode; and
injecting an encapsulation material, such that the encapsulation material is injected into the first space and excluded from the second space,
the injected encapsulation material forming an encapsulation member coupled to and covering at least a portion of the substrate, the encapsulation member including a housing unit housing the electrode,
the electrode having a conductive sidewall exposed to, and not in contact with the encapsulation member, such that there is open space between the conductive sidewall of the electrode and the encapsulation member from an uppermost surface to a bottommost surface of the encapsulation member, the substrate having a portion exposed within the open space, the encapsulation member having an open cross-section perpendicular to an upper surface of the substrate and aligned along an extension line intersecting the electrode.

10. The method of claim 9, wherein the wiring member includes one of:
a bonding clip;
a bonding ribbon; or
a bonding wire.

11. The method of claim 9, further comprising, prior to coupling the electrode with the substrate, disposing a bonding member on the substrate, the electrode being coupled to the substrate via the bonding member.

12. The method of claim 9, wherein the second space has a depth in the top mold die that is, relative to an upper surface of the substrate, greater than a depth of the first space in the top mold die.

13. A method comprising:
coupling a first semiconductor chip and a second semiconductor chip with a substrate;
coupling a first electrode and a second electrode arranged with the substrate;
mounting the substrate on a bottom mold die and connecting the bottom mold die to a top mold die, the top mold die:
defining a first space, a second space and a third space, the second space and the third space being separated from the first space,
the first space housing the first semiconductor chip and the second semiconductor chip and, at least partially, surrounding respective perimeters of the second space and third space, and
the second space housing the first electrode;
the third space housing the second electrode; and
injecting an encapsulation material, such that the encapsulation material is injected into the first space, excluded from the second space, an excluded from the third space,
the injected encapsulation material forming an encapsulation member coupled to and covering at least a portion of the substrate, the encapsulation member including a first housing unit housing the first electrode and a second housing unit housing the second electrode,
the first electrode and the second electrode each having a conductive sidewall exposed to the encapsulation member,
the first electrode having an upper surface and a portion of the conductive sidewall extending above the encapsulation member,
the conductive sidewall of the first electrode not being in contact with the first housing unit of the encapsulation member, such that there is open space of a first distance between the conductive sidewall of the first electrode and the first housing unit of the encapsulation member from an uppermost surface to a bottommost surface of the encapsulation member,
the conductive sidewall of the second electrode not being in contact with the second housing unit of the encapsulation member, such that there is open space of a second distance between the conductive sidewall of the second electrode and the second housing unit of the encapsulation member from the uppermost surface to the bottommost surface of the encapsulation member, the second distance being different from the first distance.

14. The method of claim 13, wherein the upper surface of the second electrode is disposed higher than the uppermost surface of the encapsulation member relative to an upper surface of the substrate.

15. The method of claim 13, further comprising, prior to connecting the bottom mold die to the top mold die:
forming a first wiring member electrically connecting the first semiconductor chip with the first electrode; and
forming a second wiring member electrically connecting the second semiconductor chip with the second electrode.

16. The method of claim 15, wherein the first wiring member and the second wiring member are housed within the first space and encapsulated within the encapsulation material.

17. The method of claim 15, wherein forming the first wiring member includes:
- coupling the first wiring member with the first semiconductor chip via a first bonding member; and
- coupling the first wiring member with the substrate via a second bonding member.

18. The method of claim 15, wherein the first wiring member and the second wiring member respectively include one of:
- a bonding clip;
- a bonding ribbon; or
- a bonding wire.

19. The method of claim 15, further comprising, prior to coupling the first electrode and the second electrode with the substrate, disposing a first bonding member and a second bonding member on the substrate, the first electrode and the second electrode being respectively coupled to the substrate via the first bonding member and the second bonding member.

20. The method of claim 13, wherein the second space and the third space have respective depths in the top mold die that are, relative to an upper surface of the substrate, greater than a depth of the first space in the top mold die.

* * * * *